United States Patent [19]

Koike et al.

[11] 4,364,973

[45] Dec. 21, 1982

[54] METHOD FOR FABRICATING A SOLID-STATE IMAGING DEVICE USING PHOTOCONDUCTIVE FILM

[75] Inventors: Norio Koike, Tokyo; Toru Baji, Kokubunji; Toshihisa Tsukada, Sekimachi; Hideaki Yamamoto, Hachioji, all of Japan

[73] Assignee: Hitachi, Ltd., Tokyo, Japan

[21] Appl. No.: 247,737

[22] Filed: Mar. 26, 1981

[30] Foreign Application Priority Data

Mar. 26, 1980 [JP] Japan .................................. 55-37463

[51] Int. Cl.³ ......................... B05D 1/32; H01L 31/18
[52] U.S. Cl. ................................. 427/75; 204/192 P
[58] Field of Search ........................ 427/75; 204/192 P

[56] References Cited

U.S. PATENT DOCUMENTS 4,181,755  1/1980  Liv et al. .......................... 427/75 X

Primary Examiner—James R. Hoffman
Attorney, Agent, or Firm—Antonelli, Terry & Wands

[57] ABSTRACT

A method for fabricating a solid-state imaging device using photoconductive film, comprising the step of depositing a photoconductive material onto a scanner IC by the use of a shield plate, the scanner IC including vertical switching MOS transistors and horizontal switching MOS transistors arrayed in the form of a matrix and vertical and horizontal scanning shift registers for scanning the vertical and horizontal switching MOS transistors respectively, the shield plate having an open part corresponding to a vertical switching MOS transistor array area.

11 Claims, 14 Drawing Figures

METHOD FOR FABRICATING A SOLID-STATE IMAGING DEVICE USING PHOTOCONDUCTIVE FILM

BACKGROUND OF THE INVENTION

This invention relates to a method for fabricating a solid-state imaging device in which scanning circuits (scanners) and a photoconductive film are integrated on a semiconductor substrate.

As potent systems for constructing solid-state imaging devices, there have been considered the two types of the CCD type (Charge Coupled Devices) and the MOS type (a device in which the source junction of a switching insulated-gate field effect transistor is utilized as a photodiode). All these devices have the advantage that they can be fabricated with the MOS process technology of high integration density. Since, however, a photosensitive portion lies under an electrode (in the case of the CCD type) or on the same plane as that of switching transistors as well as a signal output line (in the case of the MOS type), the devices have the disadvantage that the incidence of light is hindered in many regions by the electrode or the switching transistors, in other words, that the optical dead region is large. Further, since the photosensitive area and the scanner area are even as described above, the occupation area of picture elements becomes large, that is, the integration density of picture elements cannot be made high, resulting in the problem that the resolution cannot be made high.

As a structure for solving these drawbacks (sensitivity, resolution), the inventors have provided a solid-state imaging device of the double-layer structure in which a photoconductive film is disposed on a scanner IC (Japanese Laid-open Patent Application No. 51-10715, or 'Technical Digest of Electron Devices Meeting 1979 Dec. 3-4-5', pp. 134-136, T. Tsukada et al.). By taking as an example a case where the double-layer solid-state imaging device is constructed of MOS type elements, the outline of the device structure is shown in FIG. 1A. The arrayal pattern of picture element electrodes 9 (9-1, 9-2, 9-3, 9'-1, 9'-2, 9'-3) is shown in FIG. 1B. Numeral 1 designates a semiconductor substrate of a first conductivity type, and numeral 2 an insulated-gate field effect transistor (hereinbelow, termed "MOST") which constructs a switching element adapted to be turned "on" and "off" by an output of a scanning shift register (not shown) and which consists of a drain 3, a source 4 and a gate 5. Numeral 6 designates a photoconductive film serving as a photosensitive material, numeral 7 a transparent electrode for applying a voltage which drives the photoconductive film, and numeral 8 an insulating film. Shown at numeral 11 is a signal readout electrode. As apparent from FIG. 1A, the double-layer structure is formed of an integrated circuit (IC) in which the semiconductor substrate 1 and the scanning shift register as well as the switching elements 2 are integrated, that is, a scanner IC, and a photosensor which consists of the photoconductive film 6 and the transparent electrode 7. With the solid-state imaging device of FIG. 1, accordingly, the utilization factor of area is high, and the size L per picture element is small, that is, the resolution is high. In addition, since the photosensitive portion lies at the upper part on the side of incident light 10, the optical dead region is not existent and the sensitivity is high. Further, a desired spectral response can be attained by selecting the photoconductive film properly. In such manner, performances which are much more excellent than those of the conventional solid-state imaging devices can be expected.

FIG. 1C shows an example of the construction of the double-layer solid-state imaging device. In the figure, numeral 101 indicates a horizontal scanning shift register, numeral 102 a vertical scanning shift register, numeral 103 a horizontal switching element (MOST) for selecting the horizontal position of a picture element, numeral 104 a vertical switching element (MOST) for selecting the vertical position of the picture element, numeral 105 a photosensor, numeral 106 a driving voltage terminal, numeral 107 a vertical signal output line, and numeral 108 a horizontal signal output line. The MOST 104 corresponds to the switching element 2 in FIG. 1A, and has the picture element electrode 9. The photosensor 105 consists of the photoconductive film 6 and the transparent electrode 7 in FIG. 1A. When the MOSTs are of the n-channel type and the photoconductive film is an Se-As-Te chalcogenide film, a driving voltage to be applied to the terminal 106 is approximately 50 V and a target voltage $V_T$ is approximately 1 V.

Hereupon, the double-layer device has the problem in fabrication that an etchant for etching the materials for use as the photoconductive film has not been found yet, or that even if it is found in the future, the materials cannot be dipped in the etchant because of poor immunities to chemicals (in other words, intense chemical activities). Inevitably, the photoconductive film is disposed on the whole surface of the scanner IC. As a result, the photoconductive film and the transparent electrode are disposed also on the scanning shift register, and the driving high voltage applied to the transparent electrode is feared to bring the scanning shift register into a malfunction.

Image pickup tubes employ a large number of photoconductive materials including Se-As-Te, amorphous Si, PbO, CdTe, CdS, etc. The image pickup tubes, however, require only the step of evaporating the materials on glass plates and do not require the step of forming a pattern (removing the materials in unnecessary regions). Accordingly, the problem concerning the immunity of the photoconductive film against chemicals is a difficulty peculiar to the case of fabricating the solid-state imaging device (double-layer device).

SUMMARY OF THE INVENTION

An object of this invention is to provide a method for fabricating a double-layer solid-state imaging device as solves the problem in fabrication stated above. That is, an object of this invention is to provide a method for fabricating a solid-state imaging device as can avoid the disposition of a transparent electrode on an area of scanning shift registers overlying a scanner IC.

It is also an object of this invention to provide a method for fabricating a solid-state imaging device as can dispose a photoconductive film on an area of picture elements overlying a scanner IC, in other words, a picture element electrode array area and can avoid the disposition of the photoconductive film on an area of scanning shift registers in a peripheral part overlying the scanner IC.

In order to accomplish the objects, this invention works a photoconductive film without resorting to the photoetching process which is generally used in the fabrication workings of ICs (integrated circuits) and LSIs (large-scale integrated circuits). Concretely, a shield plate which is provided with an opening part corresponding to an area to form the photoconductive film therein is arranged over a scanner IC (or scanner LSI), whereupon the photoconductive film is formed.

In an example of the method according to this invention for fabricating a solid-state imaging device, a photoconductive film is deposited onto a scanner IC (or scanner LSI) by evaporation, sputtering or the like by employing a shield plate which has an opening part corresponding to a picture element electrode array area overlying the scanner IC (or scanner LSI).

DESCRIPTION OF THE PREFERRED EMBODIMENTS

Hereunder, this invention will be described in detail with reference to embodiments. FIGS. 2A-2I are views which show the fabricating steps of a double-layer solid-state imaging device according to this invention. While MOSTs are used as the elements of a scanner IC here, a scanner IC employing CCDs may well be adopted, and the fabricating steps of this invention are quite similar for both the scanner ICs.

Since the two sorts of a manufacturing process in the state in which a large number of scanner IC chips are still arrayed on a Si semiconductor wafer and a manufacturing process in the state in which the scanner IC chips are individually cut out from the wafer are considered as fabricating methods, they will be respectively explained. The substance of the fabricating working process, however, is the same in both the cases.

(i) Manufacturing process in the chip state:

The fabricating steps are illustrated in FIGS. 2A-2I.

Figure 1A:
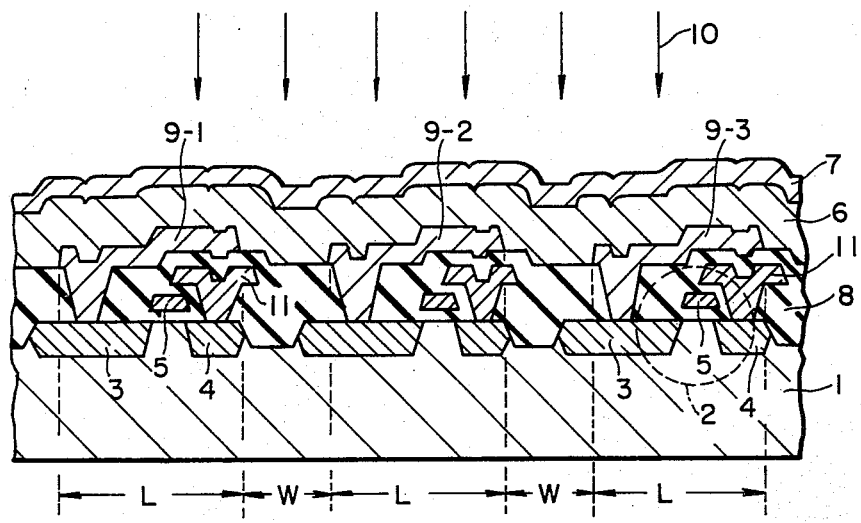
FIG. 1A is a schematic sectional view showing the structure of a double-layer solid-state imaging device.
Figure 1B:
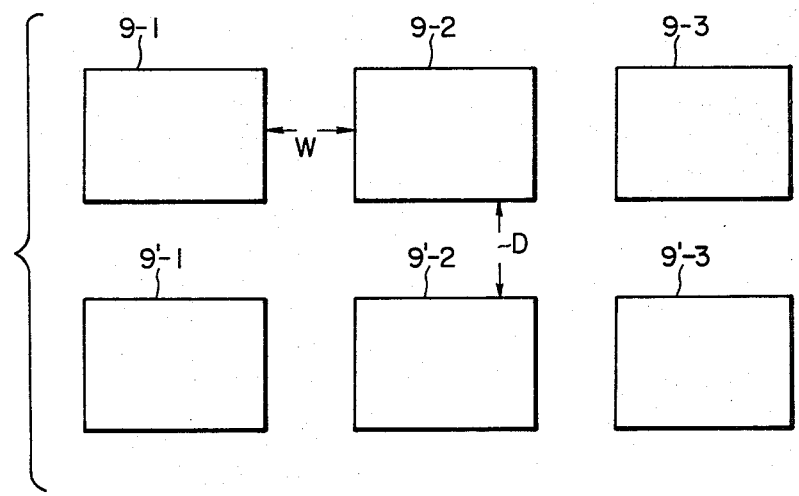
FIG. 1B is a plan view showing the arrayal pattern of picture element electrodes.
Figure 1C:
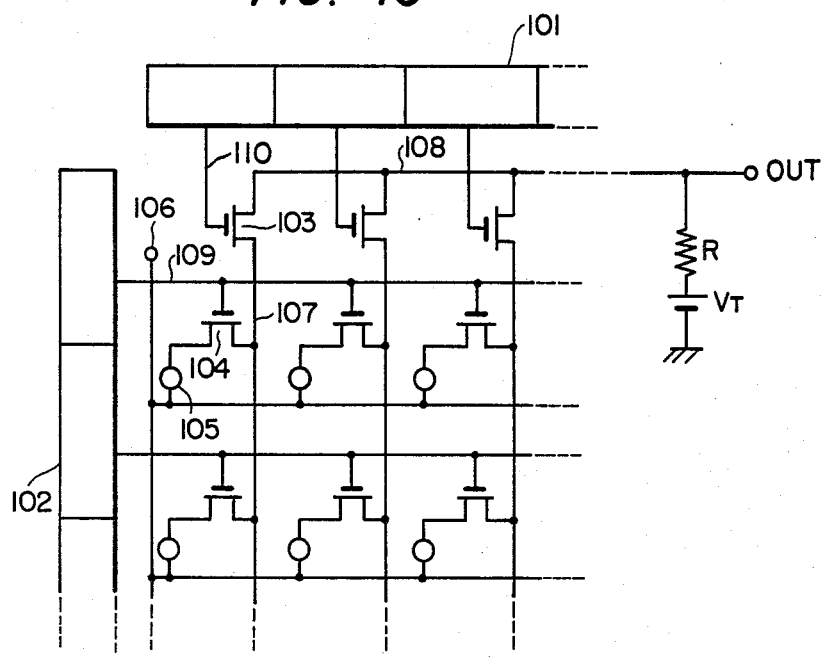
FIG. 1C is a schematic circuit diagram showing an example of the construction of the double-layer solid-state imaging device.
Figure 2A:
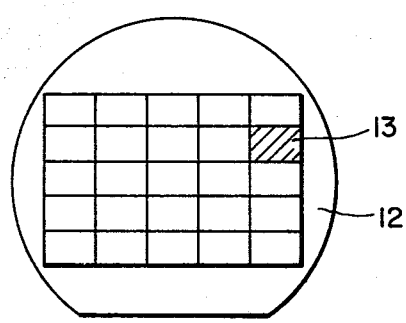
FIG. 2A is a view showing a wafer in which scanner IC chips are arrayed.

In FIG. 2A, numeral 12 designates a semiconductor (for example, Si) wafer wherein a large number of scanner IC chips 13 each of which has been completed up to the formation of picture element electrodes arrayed in two dimensions are arrayed.

Figure 2B:
FIG. 2B is a view showing the scanner IC chip which has been cut out from the wafer.
Figures 2C, 2D:
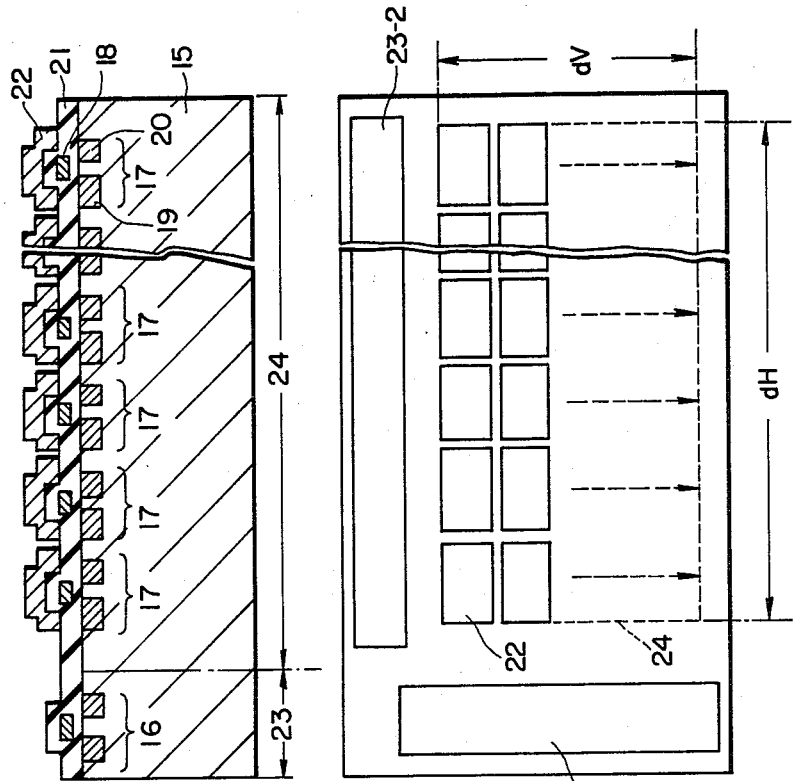
FIGS. 2C, 2E, 2F, 2H and 2I are schematic sectional views showing an embodiment of a method of this invention for fabricating a solid-state imaging device, in the order of fabricating steps.
FIG. 2D is a plan view showing a layout pattern in FIG. 2C.

In FIG. 2B, the scanner IC chips 13 having been arrayed in the large number are split into individual IC chips 14 by slicing the wafer. A sectional structure of the chip is shown in FIG. 2C. Here, numeral 15 indicates a semiconductor (for example, Si) substrate of a first conductivity in which MOSTs 16 constituting scanning shift registers and MOSTs 17 serving as switching elements are integrated, numeral 18 a gate electrode which forms the MOST, and numerals 19 and 20 a drain and a source which are made of impurity diffused layers of a second conductivity type, respectively. Numeral 21 indicates an insulating film (usually, $SiO_2$ is utilized), and numeral 22 picture element electrode patterns arrayed in two dimensions, the pattern determining the size of one picture element. The connection between the picture element electrode 22 and the drain region 19, and a signal readout electrode to be connected with the source region are omitted from the illustration. Numeral 23 denotes a scanning shift register area (here, a vertical scanning circuit to be described below is shown), and numeral 24 an area in which the picture element electrodes 22 are arrayed in two dimensions and which is to become a photosensitive area.

FIG. 2D is a plan view with the chip 14 seen from above. 23-1 indicates the vertical scanning circuit area for executing scanning in the Y direction, 23-2 a horizontal scanning circuit area (not shown in FIG. 2C) for executing scanning in the X direction, and 24 the photosensitive area consisting of the matrix patterns of the picture element electrodes 22 (the first two rows are depicted, and the succeeding rows are indicated by dotted arrows).

Figure 2E:
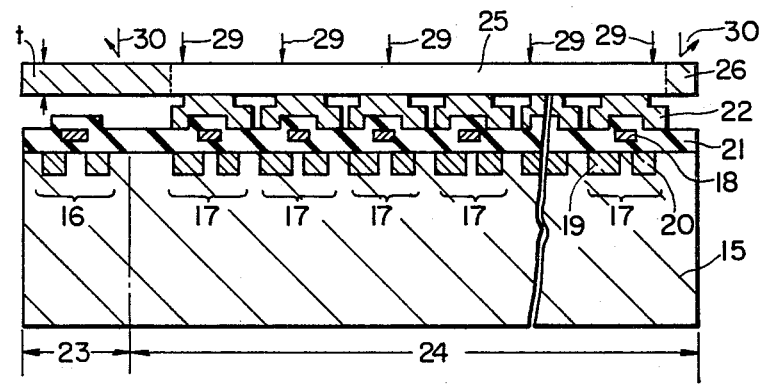
Figure 2F:
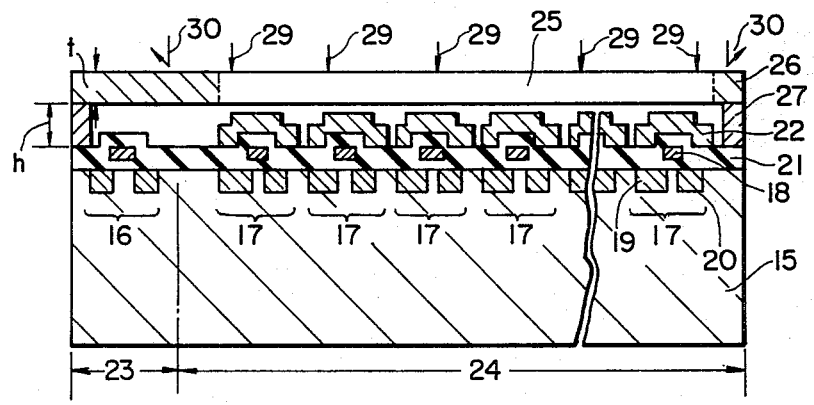
Figure 2G:
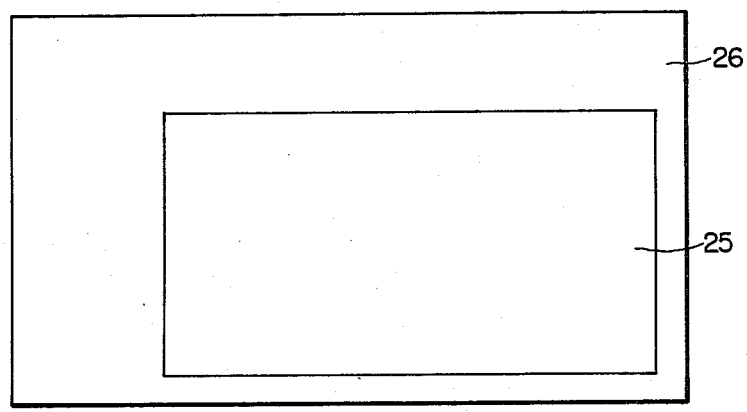
FIG. 2G is a plan view showing a shield plate (mask plate) for use in an embodiment of this invention.
Figure 2H:
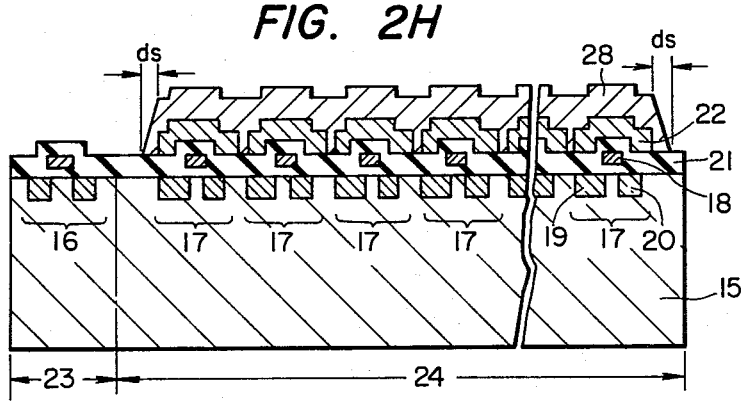

In FIG. 2E, a shield plate (mask plate) 26 provided with a window 25 in correspondence with only the photosensitive area is placed on the resultant chip in close contact therewith. Alternatively, as shown in FIG. 2F, the mask plate is placed in such a way that spacers 27 or the like are inserted between the chip and the mask plate at peripheral parts of the chip so as to afford some clearance therebetween. The clearance in the latter measure is a consideration for preventing any damage of the scanner IC in which the transistors etc. are integrated. A plan view of the shield plate is shown in FIG. 2G. Subsequently, under this state, a photoconductive film 28 for photoelectric conversion such as Se-As-Te and PbO is formed on the photosensitive area to a thickness of approximately 0.5-5 μm by the evaporation process or sputtering process 29 (FIG. 2H). During the formation, the chip needs to be heated to 50° C.-several hundred °C. for some materials used. Accordingly, the mask plate 26 serving as a shield in the case of the evaporation or sputtering is preferred to be heat-resistant, and the use of, e.g., a metal plate (of stainless steel, copper, iron, aluminum, or the like) is desirable. The thickness t of the metal mask may be to the extent that no unevenness arises within the chip area, and for example, in the case of the stainless steel plate, a thickness of several hundred μm suffices.

Even in the case of FIG. 2E, it is difficult to bring the mask and the chip into perfect close contact. In actuality, accordingly, the deposition spreads beyond the opening part (FIG. 2H). According to the inventors' measurements, the widening fringe size $d_s$ becomes approximately 100-200 μm in the case of the close contact or the case of FIG. 2E, and it becomes above 200 μm in the case of FIG. 2F though it depends upon the size h of the spacer. Such consideration is therefore necessary that the designed dimensional value of the opening part is made smaller by $d_s$ than the dimensions ($d_H$, $d_V$) of the photosensitive area 24 to be formed ($d_H$–$d_s$, $d_V$–$d_s$). Unless the opening part is not made smaller, it is desirable that the horizontal and vertical scanning circuits are spaced from the photosensitive area the widths of or above $d_s$ in advance in the design of the scanner IC. On the other hand, in case where the allowance $d_s$ has not been set between the respective areas, the photoconductive film is also deposited in a part of the scanning shift register area. Even in this case, no problem in operation is tentatively involved because the photoconductive film and the scanning shift registers are insulated by the oxide film. Since, however, a voltage is applied over the oxide film as will be stated later, the existence of pinholes etc. in the oxide film brings about the danger that the voltage will be transmitted to the scanning shift registers (the so-called shorting) to render the circuit operation impossible. It is therefore desirable to perform the design with the spreading size $d_s$ taken into account as described above.

Figure 2I:
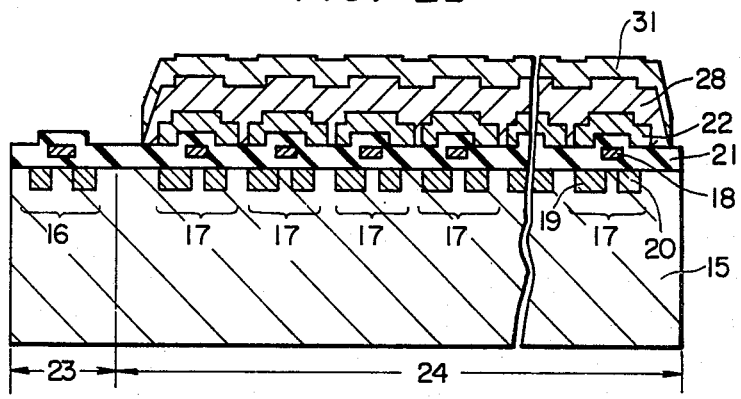

After the photoconductive film 28 has been formed, as shown in FIG. 2I a transparent electrode 31 which applies the voltage for driving the photoconductive film is formed on the photoconductive film 28 by the use of a metal mask plate having an opening part as in FIG. 2E or FIG. 2F. Here, the metal mask plate may be the same mask plate 26 as in FIG. 2E or 2F, or may well be a separate mask plate having unequal opening dimensions. In the former case, the evaporation of the transparent electrode may be started directly without detaching the mask plate, whereas in the latter case, the metal mask plate needs to be replaced. Here, the reason why the separate mask plates of unequal dimensions are used is that the transparent is intended to fully cover the underlying photoconductive film or that the spreading (the foregoing $d_s$) at the evaporation or sputtering of the transparent electrode differs from the spreading in the case of the photoconductive film. The opening size is made larger or smaller than that of the mask plate for forming the photoconductive film. When the opening part of the mask for the transparent electrode is made smaller, the following is also possible. That is, even if the photoconductive film has been deposited on the scanning shift register area on the scanner IC, the transparent electrode can be deposited on only the photosensitive area. Also with this measure, the object of this invention can be achieved.

On the other hand, as the materials of the transparent electrode, there can be used $SnO_2$, $InO_2$ etc. which are generally known well, a thin metal film of 50–200 Å and a polycrystalline silicon film of approximately 100–1,000 Å which are, however, somewhat lower in transparency, and so forth. During the evaporation or sputtering of the transparent electrode, some materials used require to raise the temperature of the chip up to 100°–500° C. similarly to the case of the deposition of the photoconductive film. The chip having completed the formation of the transparent electrode is mounted on a package, and wires are bonded onto a bonding pad situated around the chip, whereby the fabrication of the double-layer imaging device is finished (not shown).

Figure 3:
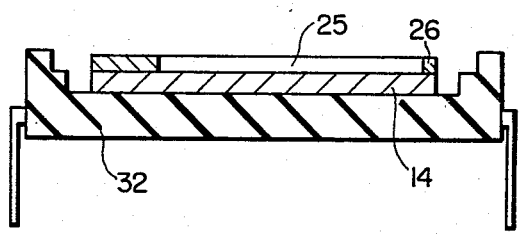
FIG. 3 is a schematic sectional view of an embodiment of this invention showing the state in which the shield plate (mask plate) is set with the scanner IC chip placed on a package.

Although the fabricating method in which the metal mask plate is stacked on the chip has been stated in the above embodiment, it is also possible that, as shown in FIG. 3, after the chip 14 has been mounted on a package 32, the metal mask plate 26 is stacked thereon for the fabrication (here, the case of the close contact is shown). Regarding this method, the fabricating steps are quite the same as in the embodiment of FIGS. 2A–2I.

Figure 4:
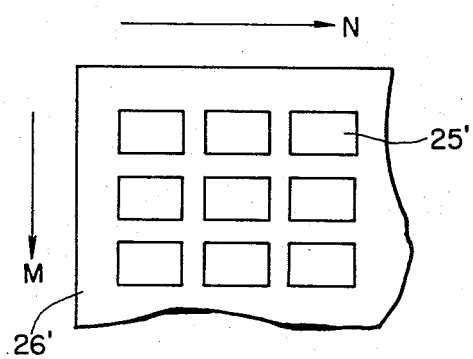
FIG. 4 is a plan view of a shield plate (mask plate) for use in another embodiment of this invention.

(ii) Manufacturing process in the wafer state:

In this case, the fabricating steps are the same as in the embodiment of FIGS. 2A–2I. Since, however, the scanner IC chips are not separate but are arrayed on the identical wafer, a metal mask plate for masking at the deposition of the photoconductive films and the transparent electrodes is different. FIG. 4 is a plan view of the metal mask plate 26' for use in the case of the fabrication in the wafer state (the first three rows and three columns are depicted). In the mask, opening parts 25' as explained with reference to FIG. 2G are provided at pitches equal to the arrayal pitches of the scanner ICs on the wafer and in a number equal to that of the arrayed chips on the wafer.

The advantage of this method is that the mass-producibility is good because a large number of (N×M) double-layer devices can be formed at the same time. On the other hand, this method involves the problems that the wafer bends actually, that the metal mask itself is large-sized and therefore flexes, etc. These lead to such a problem that the spreading sizes $d_s$ before stated become unequal among the devices in the wafer. Accordingly, it is required to design the opening parts or the scanner ICs themselves in consideration of the dispersion of the spreading dimensions $d_s$.

In the foregoing embodiments, the method in which also the transparent electrode is formed by the use of the metal mask has been referred to. Since, however, some transparent conductive materials have had their etchants already developed, it is also possible to work the transparent electrode with the photoetching process as used for conventional ICs. Since the underlying photoelectric material is scanty of immunity against chemicals as described before, it is considered that the working with the metal mask plate is more desirable.

As described above in detail in connection with the embodiments, according to this invention, a metal mask plate for shielding against evaporation or against sputtering is set over a scanner IC in the working of a photoconductive film or/and the working of a transparent electrode overlying the photoconductive film, whereby a double-layer imaging device can be simply fabricated.

The advantages of this invention are as follows:

(1) Since no chemicals is used, the photoconductive film is not degraded.

(2) The metal mask is less expensive than a photomask used for conventional ICs and can be used semipermanently owing to its freedom from wear or damage, and no chemicals is consumed, so that the fabricating method of this invention is very cheap.

Owing to the fabricating method of this invention, the inventors could produce double-layer imaging devices at a high available percentage and could achieve good image pickup. Through the assessments of the characteristics of the devices, it has been confirmed that the present invention is extraordinarily valuable in practical use.

Even in case where junction type field effect transistors, bipolar transistors, or CID (Charge Injection Devices) reported recently, other than the foregoing MOSTs and CCDs are adopted as the constituent elements of the scanner IC of the double-layer imaging device, the double-layer imaging device can be fabricated by quite the same manufacturing method as in this invention.

As regards the details of the construction, operation and manufacturing method of the double-layer solid-state imaging device concerning this invention, reference can be had to U.S. Ser. No. 66,230 (filed Aug. 13, 1979) being an application prior to the present application, or Application Laying-open Specification No. 2,029,642 (laid open Mar. 19, 1980) of the corresponding British application, and to U.S. Ser. No. 154,999 (filed May 30, 1980) being another prior application of the present application.

What is claimed is:

1. A method for fabricating solid-state imaging devices wherein a photoconductive film for photoelectric conversion to generate photocharges and a transparent electrode are stacked on a scanner integrated circuit in which switching elements in a two-dimensional array and scanning shift registers for scanning the switching elements are integrated, characterized by forming said photoconductive film by the steps of holding a shield plate which is open in only an area to form said photoconductive film, in close contact with said scanner integrated circuit or with some spacing therefrom, and depositing a photoconductive material onto said scanner integrated circuit, whereby said shield plate prevents deposition of photoconductive material on areas of said scanner integrated circuit not corresponding to the open part of the shield plate.

2. A method for fabricating solid-state imaging devices according to claim 1, wherein the open part of said shield plate corresponds to an area of the switching element array.

3. A method for fabricating solid-state imaging devices according to claim 2, wherein said open part of said shield plate is smaller than the switching element array area.

4. A method for fabricating solid-state imaging devices according to claim 2, wherein at least one of an element and circuit around the switching element array is disposed in a manner to be spaced from the switching element array area at least a deposition fringe size of said photoconductive material.

5. A method for fabricating solid-state imaging devices according to claim 1, 2, 3 or 4, comprising the step of depositing after the deposition of said photoconductive material a substance to become a material of said transparent electrode onto said photoconductive film by the use of said shield plate or a shield plate which is somewhat different therefrom in opening size and in shape.

6. A method for fabricating solid-state imaging devices according to claim 5, wherein the shield plate used to deposit the material of the transparent electrode has a smaller open part than the open part of the shield plate used in depositing said photoconductive material.

7. A method for fabricating solid-state imaging devices according to claim 1, 2, 3 or 4, comprising the step of depositing after the deposition of said photoconductive material a substance to become a material of said transparent electrode onto said scanner integrated circuit provided with said photoconductive film, and the step of etching the deposited transparent electrode substance layer into a transparent electrode film in a predetermined shape by photoetching.

8. A method for fabricating solid-state imaging devices according to claim 1, 2, 3 or 4, wherein a single scanner integrated circuit is provided, and said shield plate has a single open part which corresponds to the area of said scanner integrated circuit on which the photoconductive material is deposited.

9. A method for fabricating solid-state imaging devices according to claim 1, 2, 3 or 4, wherein a plurality of scanner integrated circuits are provided arrayed on a wafer, and said shield plate has a plurality of open parts, with each open part corresponding to an area of a scanner integrated circuit on which the photoconductive material is deposited.

10. A method for fabricating solid-state imaging devices according to claim 1, wherein said shield plate is made of metal.

11. A method for fabricating solid-state imaging devices according to claim 10, wherein said metal is selected from the group consisting of stainless steel, copper, iron and aluminum.

* * * * *